United States Patent [19]
Goldberg et al.

[11] Patent Number: 5,909,306
[45] Date of Patent: Jun. 1, 1999

[54] SOLID-STATE SPECTRALLY-PURE LINEARLY-POLARIZED PULSED FIBER AMPLIFIER LASER SYSTEM USEFUL FOR ULTRAVIOLET RADIATION GENERATION

[75] Inventors: Lew Goldberg, Fairfax, Va.; Dahv A. V. Kliner, San Ramon, Calif.; Jeffrey P. Koplow, Washington, D.C.

[73] Assignee: President and Fellows of Harvard College

[21] Appl. No.: 09/096,639

[22] Filed: Jun. 12, 1998

Related U.S. Application Data

[63] Continuation-in-part of application No. 09/016,108, Jan. 30, 1998, which is a continuation-in-part of application No. 08/640,568, May 1, 1996, Pat. No. 5,745,284, which is a continuation-in-part of application No. 08/609,768, Feb. 23, 1996, abandoned.

[51] Int. Cl.$^6$ .................. H01S 3/00; H01S 3/30
[52] U.S. Cl. ............ 359/341; 359/347; 372/6; 372/25
[58] Field of Search ................ 359/341, 347; 372/6, 25

[56] References Cited

U.S. PATENT DOCUMENTS

| | | | |
|---|---|---|---|
| Re. 35,215 | 4/1996 | Waarts et al. | 372/108 |
| 4,907,238 | 3/1990 | Chun et al. | 372/32 |
| 5,175,643 | 12/1992 | Andrews | 359/339 |
| 5,177,752 | 1/1993 | Ohya et al. | 372/22 |
| 5,321,718 | 6/1994 | Waarts et al. | 372/108 |
| 5,457,707 | 10/1995 | Sobey et al. | 372/20 |
| 5,530,582 | 6/1996 | Clark | 359/333 |
| 5,561,676 | 10/1996 | Goldberg | 372/18 |
| 5,745,284 | 4/1998 | Goldberg et al. | 359/344 |
| 5,778,015 | 7/1998 | Gunning et al. | 372/25 |

OTHER PUBLICATIONS

N. Finkelstein, et al., "The Development of a Tunable Single–Frequency Ultraviolet Laser Source for UV Filtered Rayleigh Scattering," *Dept. of Mechanical & Aerospace Engineering,* Princeton University, Princeton, NJ 08544, pp. 1–7 (Jan. 10–13, 1994).

T. Meguro, et al., "Solid–State Tunable Deep–Ultraviolet Laser System from 198–300 nm," *Optics Letters,* 19(2):102–104 (Jan. 1994).

C. Zimmerman, et al., "All Solid State Laser Source for Tunable Blue and Ultraviolet Radiation," *Appl. Phys. Lett.* 66(18):2318–2320 (May 1995).

L. Goldberg, et al., "Tunable UV Generation at 286 nm By Frequency Tripling of a High–Power Mode–Locked Semiconductor Laser," *Optics Letters,* 20(15):1640–1642 (Aug. 1995).

L. Goldberg, et al., "Deep–UV Generation by Frequency Quadrupling of a High–Power GaAlAs Semiconductor Laser," *Optics Letters,* 20(10):1145–1147 (1995).

L.E. Busse, et al., "3•0W Blue Light Generation by Frequency Doubling of Broad Area Semiconductor Amplifier Emission," *Electronics Letters* 29(1):776–78 (Jan. 1993).

(List continued on next page.)

*Primary Examiner*—Mark Hellner
*Attorney, Agent, or Firm*—Hamilton, Brook, Smith & Reynolds, P.C.

[57] ABSTRACT

A solid-state laser source of tunable and narrow-bandwidth UV light is disclosed. The system utilizes a fiber amplifier in a resonant cavity. An acousto-optic or electro-optic modulator is incorporated into the cavity in such a way that the energy stored in the gain medium is efficiently extracted in the form of high-peak-power, short-duration pulses. In addition, narrow bandwidth and linearly polarized output are simultaneously achieved. The light from the cavity is converted into the ultraviolet by frequency tripling, quadrupling, and/or quintupling the infrared light. The narrow bandwidth, or relatively pure light, is preserved with intracavity filtering, and the high peak light powers increase the efficiency of the nonlinear crystals in the frequency conversion stage.

25 Claims, 8 Drawing Sheets

OTHER PUBLICATIONS

L. Goldberg, et al., "Blue Light Generation Using a High Power Tapered Amplifier Mode–Locked Laser," *Appl. Phys. Lett.* 65(5):522–524 (Aug. 1994).

L. Goldberg, et al., "High Power Continuous Wave Blue Light Generation in $KNbO_3$ Using Semiconductor Amplifier Seeded by a Laser Diode," Appl. Phys. Lett. 63(17):2327–2329 (Oct. 1993).

D. Rafizadeh, et al., "Kilowatt Pulses at 1.55 μm from a Singlemode Erbium–Doped Fibre Amplifier," *Electronics Letters,* 30(4):317–318 (Feb. 17, 1994).

B. Desthieux, et al., "111 kW (0.5mJ) Pulse Amlification at 1.5 μm Using a Gated Cascade of Three Erbium–Doped Fiber Amplifiers," *Appl. Phys. Lett.* 63(5):586–588 (Aug. 2, 1993).

I.N. Duling, III, et al., "Single–Polarisation Fibre Amplifier," *Electronics Letters,* 28(12):1126–1128 (Jun. 4, 1992).

Taverner, D., et al., "158 –μJ Pulses from a Single–Transverse–Mode, Large–Mode–Area Erbium–Doped Fiber Amplifier," *Optics Letters,* 22(6):378–380 (Mar. 15, 1997).

Rafizadeh, D., et al., "Kilowatt Pulses at 1.55 μm from a Singlemode Erbium–Doped Fibre Amplifier," *Electronics Letters,* 30(4):317–318 (Feb. 17, 1994).

S. C Rashleigh, et al., "High Birefringence in Tension–Coiled Single–Mode Fibers," *Optics Letters,* 5(8):354–356 (Aug. 1980).

G. P. Lees, et al., "Q–Switched Erbium Doped Fibre Laser Utilising a Novel Large Mode Area Fibre," *Electronics Letters,* 33(5):393–394 (Feb. 27, 1997).

G. Sucha, "Fiber Lasers: A Little Package Carries a Big Punch," *Photonics Spectra,* pp.: 88–93 (Dec. 1997).

L. Goldberg, et al., "V–Groove Side–Pumped 1.5 μm Fibre Amplifier," *Electronics Letters,* 33(25):2127–2129 (Dec. 4, 1997).

D.A.V. Kliner, et al., "Narrow–Band, Tunable, Semiconductor–Laser–Based Source For Deep–UV Absorption Spectroscopy," *Optics Letters,* 22(18):1418–1420 (Sep. 15, 1997).

R. Paschotta, et al., "Ytterbium–Doped Fiber Aplifiers," *IEEE Journal of Quantum Electronics* 33(7):1049–1056 (Jul. 1997).

J. Koplow, et al., "UV Generation by Frequency Quadrupling of a Yb–Doped Fiber Amplifier", *IEEE Photonics Technology Letters* 10(1):75–77 (Jan. 1998).

SOLID-STATE SPECTRALLY-PURE LINEARLY-POLARIZED PULSED FIBER AMPLIFIER LASER SYSTEM USEFUL FOR ULTRAVIOLET RADIATION GENERATION

RELATED APPLICATIONS

This application is a Continuation-in-Part of U.S. Ser. No. 09/016,108, abandoned which is filed Jan. 30, 1998, which is a Continuation-in-Part of U.S. Ser. No. 08/640,568, which is filed May 1, 1996, now U.S. Pat. No. 5,745,284 which is a Continuation-in-Part of U.S. Ser. No. 08/609,768, filed Feb. 23, 1996, abandoned the entire teachings of these three applications being incorporated herein by this reference.

BACKGROUND OF THE INVENTION

Spectroscopic detection of trace gases is used in a wide range of applications, including atmospheric monitoring, industrial process and emissions control, and combustion studies. Spectroscopic detection methods offer high specificity, high sensitivity, fast time response, quantitative determination of species concentrations (i.e., absolute calibration), and the possibility of noninvasive or remote sampling. Although broadband light sources can be used in some situations, laser sources are preferable because of their directionality, high spectral brightness (for attaining high sensitivity), and narrow bandwidth (for minimizing interferences).

For applications requiring compact or portable instrumentation, absorption spectroscopy in the mid-infrared (IR) (3–10 $\mu$m) and near-IR (0.8–3 $\mu$m) spectral regions has been successfully implemented. Ultraviolet (UV) absorption spectroscopy, however, offers several potential advantages, including larger absorption cross sections, lack of significant interference by water vapor, reduced susceptibility to interference fringes, and solar-blind detection using high-sensitivity, low-noise, low-cost detectors that operate at room temperature (typically silicon photodiodes or photomultiplier tubes).

For a number of trace gas species, ultraviolet fluorescence spectroscopy (i.e., laser-induced fluorescence, LIF) can be used instead of UV absorption spectroscopy to extend measurement sensitivity by a factor of 1000 or more.

Unfortunately, wide application of absorption, LIF, and other spectroscopic detection schemes in the ultraviolet (e.g., laser-enhanced ionization (LEI), resonantly-enhanced multi-photon ionization (REMPI), and resonance Raman spectroscopy), for in situ and remote measurements has been prevented by the size, weight, power consumption, complexity, and cost of existing sources of tunable, narrow-bandwidth, UV radiation. At present most applications requiring tunable, narrow-bandwidth, UV radiation rely on nonlinear frequency conversion of dye lasers and of optical parametric oscillators/amplifiers (OPOs, OPAs).

In a typical frequency-converted dye laser, the second harmonic of a q-switched Nd:YAG laser is used to pump an organic dye solution that exhibits gain over a small portion (usually 10–50 $\mu$m) of the 550–1100 nm region. The output of the dye laser is then shifted in wavelength using one or more nonlinear processes. The most commonly used non-linear conversion schemes are second harmonic generation (SHG), sum frequency generation (SFG), and difference frequency generation (DFG). β-barium-borate (BBO), lithium triborate (LBO), and potassium niobate ($KNbO_3$) are examples of nonlinear crystals commonly used for wavelength conversion. Alternatively, a solid state gain medium such as Ti:sapphire (usually pumped with an argon ion laser) can be substituted for the dye laser, offering much better wavelength coverage (680–1000 nm) than is attainable with any one laser dye. Even greater wavelength coverage is provided by optical parametric oscillators and amplifiers (OPOs and OPAs), which like dye lasers are typically pumped by a frequency-converted q-switched Nd:YAG laser.

What all of the above lasers systems have in common are logistical problems in applications where size, weight, power consumption, cost, and reliability are important considerations. To overcome the physical limitations of existing UV laser systems, a number of groups have developed UV sources based on nonlinear frequency conversion of diode lasers. These sources have found very few applications, however, because they are characterized by low output power and restricted wavelength coverage. Both of these deficiencies stem from the fact that the peak powers, which are available from diode lasers, are limited to only a few Watts.

SUMMARY OF THE INVENTION

Frequency conversion of rare-earth-doped fiber lasers and amplifiers offers the possibility of a compact, lightweight, low-cost, all-solid-state, diode-pumped UV source that has low power consumption, operates at room temperature, and has no significant cooling requirements, thus yielding the advantages of the diode systems. A number of characteristics, however, make fiber lasers especially promising for generation of high-average-power, tunable, UV radiation—the primary shortcomings associated with existing diode-based solutions. Fiber lasers are broadly tunable, and different rare-earth dopants provide access to a wide range of near-IR wavelengths. Additionally, an appreciable amount of energy can be stored in the gain medium (>100 microjoules ($\mu$J)), allowing pulsed operation at high peak-power. Also, single-mode fiber lasers have intrinsically high beam quality, which is important for efficient nonlinear frequency conversion. Finally, fiber lasers can be scaled to high average powers (tens of Watts) if required. And, it should be emphasized that these characteristics will also facilitate nonlinear conversion of fiber sources to wavelengths throughout the IR and visible spectral regions, and other applications where these characteristics are useful.

In general, according to one aspect, the invention features a pulsed fiber amplifier laser system. A fiber amplifier functions as a cavity gain element, which, in combination with a temporal filter such as an acousto-optic or electro-optic modulator, forms a q-switched system. The modulator is controlled to selectively remove loss from the cavity enabling optical signals in the cavity to build up in power. At least one wavelength bandpass filter should be included in the cavity to remove undesirable wavelengths from the optical signals to create a pulse with good to excellent spectral purity.

In the preferred embodiment, the fiber is arranged in a double pass arrangement with at least two mirrors at either end defining a resonant cavity. Additionally, the modulator is preferably used to shape and narrow the generated pulse, in a process referred to as gated q-switching.

In the preferred application, a frequency conversion stage is added to convert a wavelength of the optical signals. This may be accomplished with combinations of second harmonic and sum frequency generation stages in specific embodiments.

Linearly polarized pulses are preferably generated to facilitate the crystal wavelength conversion. This is accomplished by polarizing elements comprising a linear polarizing filter and Faraday mirrors, one at either end of the fiber amplifier.

Alternatively, a polarization-preserving or polarizing gain fiber are used, thereby eliminating the need for the Faraday rotators.

In a further embodiment, a non-polarization preserving gain fiber is wrapped around a cylindrical mandrel in the shape of a helix. The gain fiber is made polarization preserving by the stressed-induced birefringence that results from fiber curvature. If necessary, this stress-induced birefringence is augmented by wrapping the gain fiber around the cylindrical mandrel under tension. In this embodiment, the need for the Faraday rotators is similarly eliminated.

The elimination of the Faraday rotators is a substantial advantage in some applications. These elements tend to be large and heavy due to the large permanent magnet used in their construction.

The inventive pulsed fiber laser system in its referred embodiment simultaneously achieves the following objectives:

peak power: The output of the system is in the form of very narrow, very high peak power pulses. The pulses are approximately Gaussian in shape with a full width half maximum (FWHM) approximately equal to the temporal modulator's rise/fall time (as short as 1 to 2 ns). The laser system is designed to suppress parasitic processes such as stimulated Brillioun scattering and stimulated Raman scattering.

pulse energy: The energy per pulse can be made as large as 65–70% of the energy stored in the pumped fiber. The stored energy is maximized by providing for maximum suppression of amplified spontaneous emission (ASE) in the amplifier.

output polarization: The output of the pulsed laser is a single linear polarization as required for efficient non-linear frequency conversion.

beam quality: The output beam consists of a single-transverse mode, when a single mode fiber amplifier is used.

tunability: The laser cavity has relatively low loss and can therefore be tuned far into the wings of the fiber amplifier gain profile, providing for maximum wavelength coverage.

linewidth: The laser linewidth is also easily controlled. For applications requiring extremely narrow linewidth a cw (continuous wave) seed source can be incorporated for injection seeding.

temporal profile: The laser produces pulses, the shape and amplitude of which are very stable over time. Each laser shot is free of pre- and after-pulses, and the pulse shape is symmetrical (i.e. no long trailing edge, as with conventional q-switched lasers). In many laser-based detection schemes, a clean temporal profile simplifies processing of the detector signal. For nonlinear frequency conversion, having the pulse energy concentrated in one short burst maximizes the peak power and therefore the efficiency of the nonlinear conversion process.

adjustable pulse repetition rate and pulse width: The electronics that drive the modulator are easily adjusted to change the pulse format.

low cost/low parts count: The design can be implemented from a minimal number of components, with no requirements for highly specialized or expensive components.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE DRAWINGS

Figure 1:
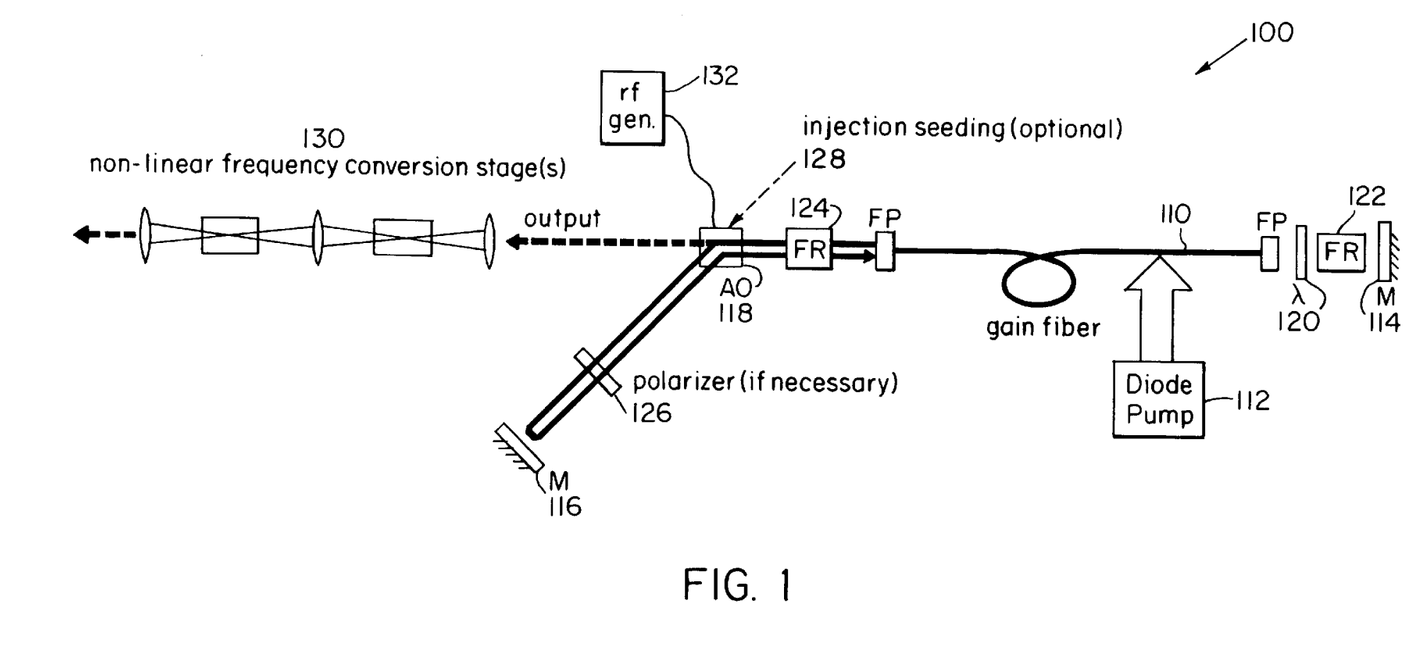
FIG. 1 is a schematic diagram of the pulsed fiber amplifier laser system of the present invention.

FIG. 1 shows the pulsed fiber amplifier laser system 100, which has been constructed according to the principles of the present invention.

A rare-earth-doped optical fiber 110 is pumped by a diode laser 112. The gain fiber 110 is preferably fabricated from any one of a number of different rare earth dopants. For example, Er and Er/Yb exhibit gain in the 1500–1600 nm spectral region. Yb fiber lasers operate between 1020–1160 nm. Nd covers the ranges 900–950, 1000–1150, and 1320–1400 nm. The slope efficiency of such rare-earth doped fibers is typically in the range of 30 to 80%.

The fiber amplifier 110 is pumped preferably by a laser diode 112. To facilitate pumping, the fiber is preferably configured in either a core-pumped (single-clad) or cladding-pumped (double-clad) geometry. A double-clad fiber is ideal because it can be pumped using low-brightness, broad-area, semiconductor laser diodes. Efficient core pumping of a single-clad fiber requires a single transverse mode laser diode source. The broad-area devices offer much higher power at much lower cost. With a double-clad fiber the pump beam is launched into either the end or side of the fiber. One advantage of side pumping is that no additional optics are required. For side pumping, a v-shaped groove is cut into the cladding of the fiber. On the opposite side of the fiber, the output of the pump diode is focused with a microlens and directed onto one of the facets of the groove. The focused beam is directed into the cladding by total internal reflection. The entire v-groove/pump diode assembly can be made very compact and does not ever require realignment of optics.

Regardless of the dopant and pumping geometry, the fiber itself preferably has as low a numerical aperture (NA) as possible. The NA of the fiber determines what fraction of spontaneous emission generated within the pumped fiber is captured and reamplified into ASE. Because the maximum population inversion (energy storage) is limited by ASE, the numerical aperture of the fiber in part determines the maximum pulse energy that can be attained (the stored energy scales as $1/NA^2$).

The peak-power capability of fiber lasers is limited by the onset of nonlinear processes that occur inside the fiber at very high optical intensities. The most important of these nonlinear processes are stimulated Brillioun scattering (SBS) and stimulated Raman scattering (SRS). Both processes are characterized by a threshold power, above which a significant portion of the energy in a high-power pulse is converted to different, generally unwanted wavelengths. The relative importance of these two loss processes depends on pulse duration and spectral bandwidth. Because the mode field diameter of the lowest order mode is inversely proportional to the numerical aperture, a low NA fiber is also desirable for suppression of SBS and SRS.

The fiber 110 is housed in a resonant cavity formed by two mirrors 114, 116. Between mirror 116 and the fiber 110 is an acousto-optic modulator (AO) or electro-optic modulator, 118, which acts as a temporal filter or q-switch. The AO 118 is normally in the off state, i.e., not driven by radio-frequency (rf) signal generator 132, allowing gain to build up in the fiber 110 as it is pumped. In this low-q state, the output of the laser is a low-power beam generated by amplified spontaneous (ASE) emission in the fiber amplifier.

When the gain has reached its maximum value (or the desired value) the AO 118 is turned on by applying an rf signal. In the on-state, the AO 118 allows a portion the ASE output (typically 50%) to be recirculated back into the amplifier. The AO is held in the on-state until the leading edge of the recirculated ASE signal has propagated a pre-determined number of round trips between mirrors 114, 116 through the amplifier. As the leading edge of the amplified ASE signal is re-entering the fiber amplifier for the final round-trip pass, the AO is the turned off; only a short pulse is allowed to recirculate through the amplifier for the final pass, which in the preferred embodiment exits directly out of the system passing only through the AO.

The power of the short pulse injected into the amplifier 110 for the final round-trip pass is made large enough to extract most of the energy stored in the fiber. The round trip gain of the fiber amplifier is large enough that the total energy extracted on previous passes is negligible in comparison. The AO is in the off-state when the amplified pulse completes the final round trip through amplifier, allowing 100% of the pulse energy to be transmitted as output. In the preferred application, the output is sent to nonlinear crystal frequency conversion stage 130 comprised of non-linear crystals and focusing lenses.

A bandpass filter 120 restricts the range of wavelengths over which multipass amplification occurs. It therefore determines the center wavelength and bandwidth of the q-switched pulses. Because the amplifier 110 is operated in a regime where the maximum population inversion is limited by ASE, the wavelength selective filter 120 is also important from the standpoint of ASE suppression. Without the filter, broadband ASE traveling from left-to-right in FIG. 1 is recirculated through the amplifier, resulting in significant gain depletion. A narrow-bandpass filter rejects nearly all of the ASE that would otherwise be recirculated and minimizes the extent to which the gain is depleted by double-pass amplification of ASE.

Depending on the how narrow a bandwidth is required, a dielectric stack bandpass filter, etalon, or multiple etalons are used as the wavelength selective filter. For a very narrow bandwidth, a combination of dielectric filters and etalons are used, with filters at either end of the gain fiber 110.

In one embodiment, two Faraday rotators (FR) 122, 124 are used to compensate for fiber birefringence, thereby providing for linear output polarization. The polarization state at the output of the laser is preserved with each round trip through the amplifier, and established initially by the AO modulator since most crystals used for AO modulators deflect preferentially a single polarization.

If the crystal chosen for the AO modulator 118 does not exhibit single polarization deflection, a polarizer 126 is added.

In alternative embodiments, the polarizing elements, such as the two Faraday rotators 122, 124, are replaced or augmented by a polarization-maintaining rare-earth-doped fiber. Such fibers are usually specially fabricated. Alternatively, a regular gain fiber, which has been wound onto a cylindrical mandrel, either loosely or under tension is used. The bending and/or bending under tension causes an elasto-optic effect, called stress-induced birefringence, which alters the polarization properties of the gain fiber. Research indicates that this process makes the gain fiber exhibit polarization-maintaining behavior.

Figure 2:
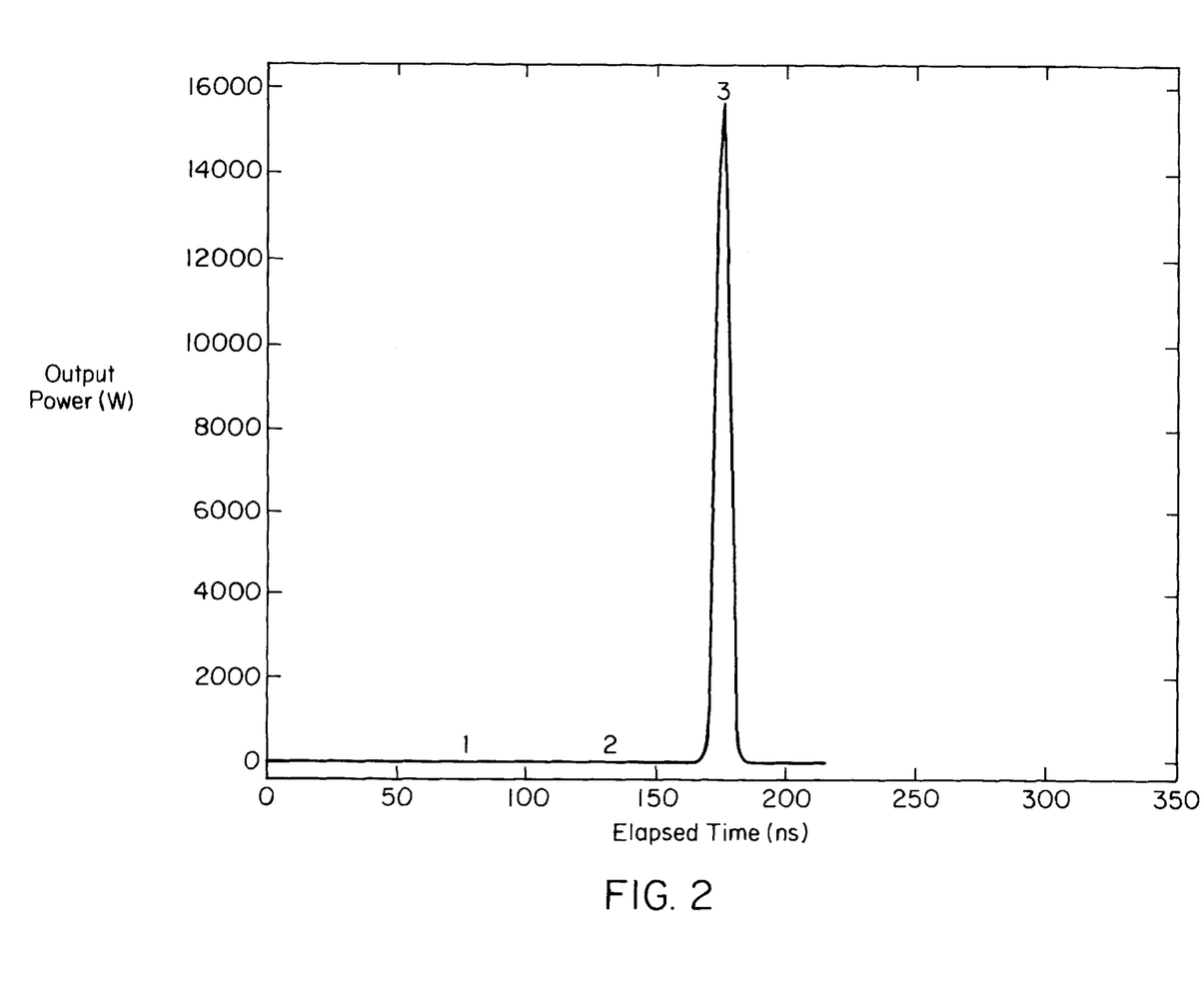
FIGS. 2 and 3 are plots of the output power measured in Watts (W) for a single pulse on a linear scale and logarithmic scale, respectively, as a function of time in nanoseconds (ns)
Figure 3:
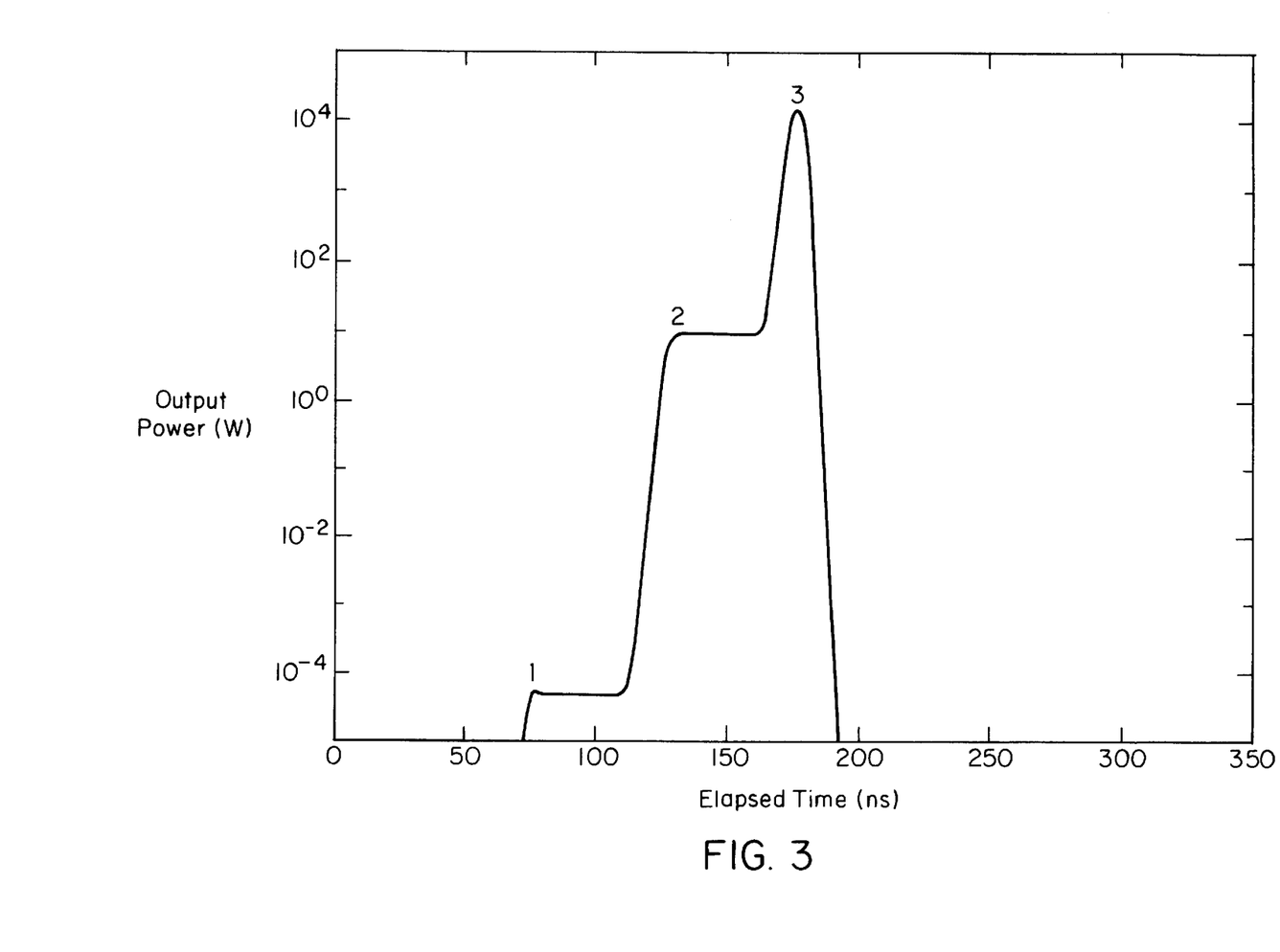

FIGS. 2 and 3 show results from a computer simulation that mathematically models operation of the pulsed laser system. In FIG. 2, the output power measured in Watts (W) for a single pulse is plotted on a linear scale as a function of time in nanoseconds (ns). In FIG. 3, the same data is replotted on a logarithmic scale. Realistic values were chosen for the parameters used in this simulation, the most important of which are given below:

length of fiber amplifier: 5.0 m single-pass small-signal gain of fiber: 30 dB energy stored in fiber: 150 µJ deflection efficiency of AO modulator: 50% rise/fall time of AO modulator: 5.0 ns

The annotations that appear in FIG. 2 and 3 denote the leading edge of the amplified pulse after 1, 2, and 3 round trips of amplification.

It is important to point out that the evolution of the amplified pulse depends in part on the ASE signal level prior to amplification. For a given number of round trip passes, if the ASE seed power is too low, the pulse injected into the amplifier for the final round trip pass will not be large enough to efficiently extract the energy stored in the fiber. If for a given number of round trip passes the ASE seed power is made too large, a prepulse is observed at the laser output and the main pulse is diminished in power. There are two solutions to this problem of maximizing the pulse extracted from the system.

In one case, the system is run in an injection-seeded configuration. Light from a cw seed laser source 128, preferably a laser diode, is injected into the resonant cavity at the AO 128 (see FIG. 1) when it is in its on state. The seed power is optimized by simply adjusting the power of the cw seed laser 128.

Figure 4A:
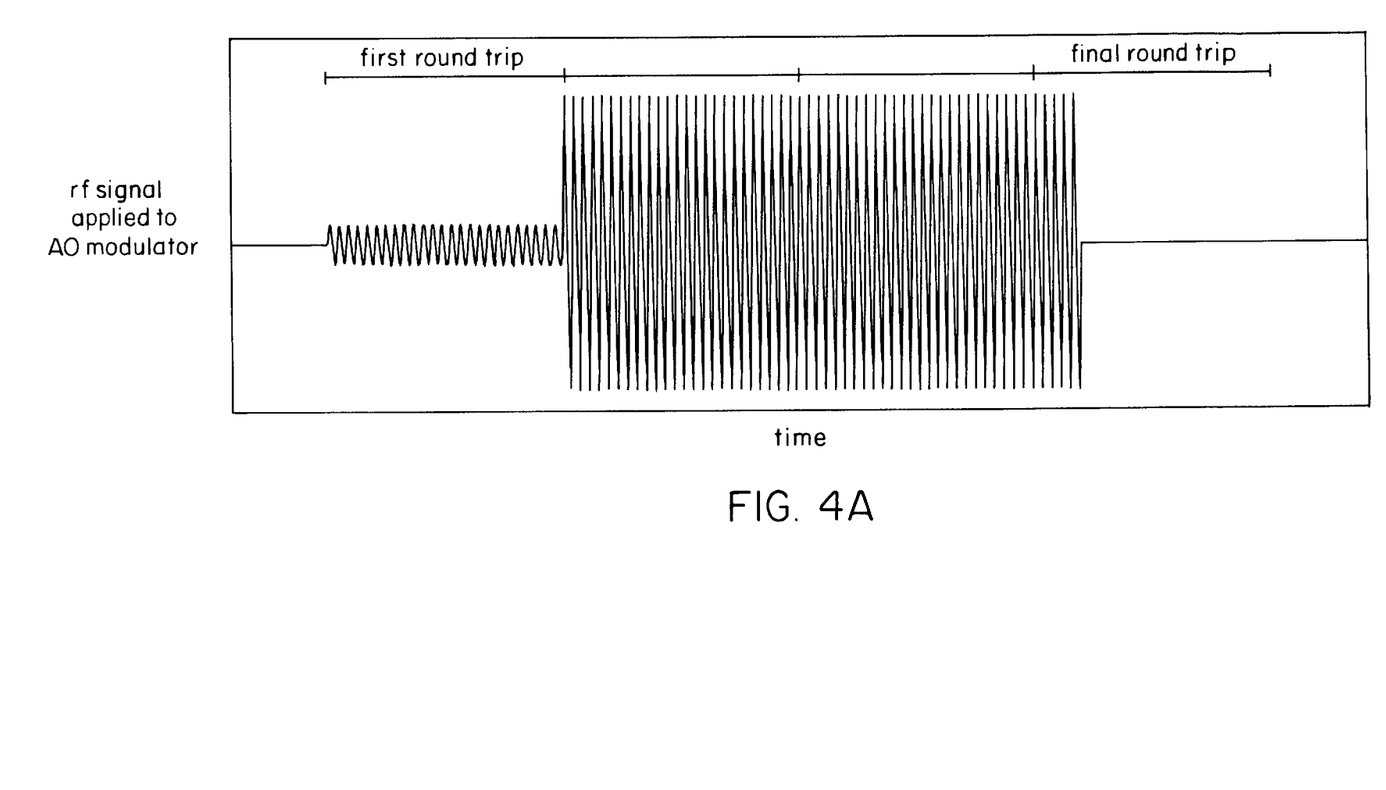
FIG. 4A is a plot of the radio frequency signal applied to the acousto-optic or electro-optic modulator 118 according to a first embodiment of the invention.

If injection seeding is not used, the effective seed power from which the amplified pulse builds is optimized by lowering the gain of the amplifier on the first round trip pass. FIG. 4A is a voltage versus time plot of the rf signal from generator 132. The present optimization is implemented by applying less than the full amount of radio-frequency (rf) power to the AO modulator 118 for the duration of the first round trip. Note that early in the evolution of the q-switched pulse, the pulse energy is very low. The total amount of energy that is wasted by running the AO at low deflection efficiency during the first round trip is therefore negligible.

Figure 4B:
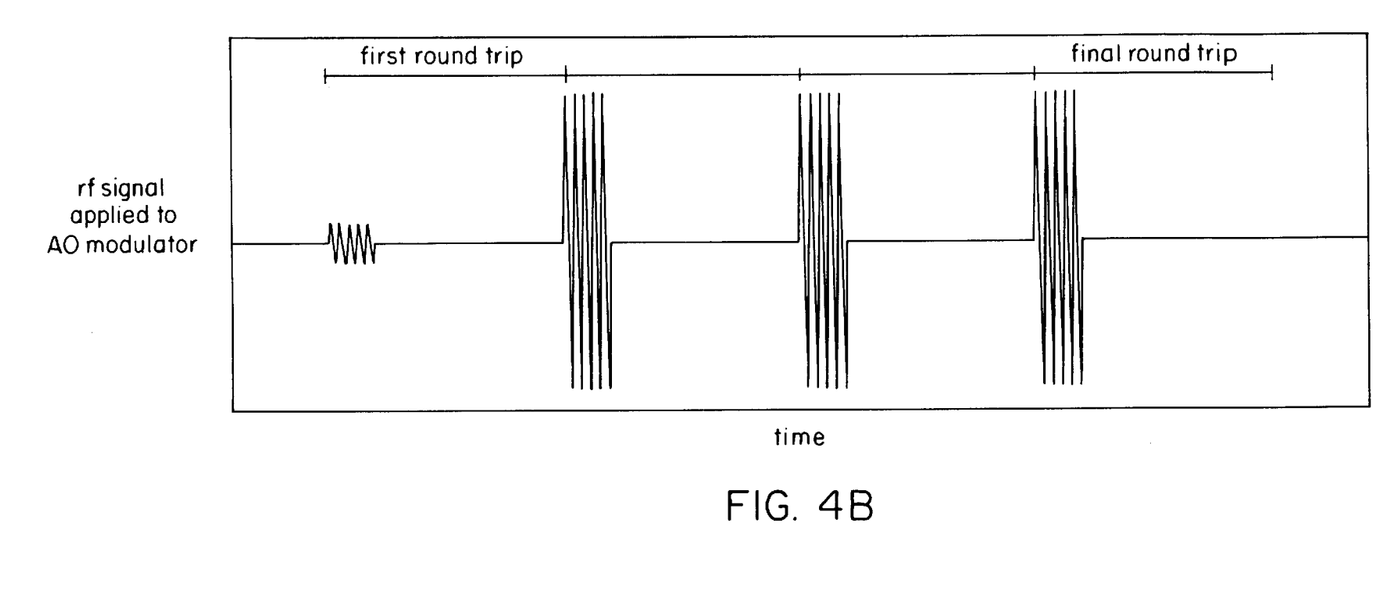
FIG. 4B is a plot of the radio frequency signal applied to the acousto-optic or electro-optic modulator 118 to implement gated q-switching according to a second embodiment of the invention.

In an alternative embodiment, the AO modulator is driven by the rf generator 132 as shown in FIG. 4B. Specifically, it is turned-on for short bursts with a periodicity of the round trip travel time of the pulse in the cavity. In addition to providing better suppression of ASE and prepulse formation, the illustrated rf waveform shown results in narrower and therefore higher power q-switched pulses. This narrowing occurs because the rising (falling) edge of the optical pulse is steepened each time it is modulated by the rising/falling edge of the AO 118. An additional advantage of running the AO at lower duty cycle is that the rf power applied to the AO during the on-state (which is limited by the amount of heat dissipated in the AO piezoelectric transducer during each laser shot) can be increased significantly. The resulting improvement in AO deflection efficiency lowers the round trip cavity loss, allowing the gated q-switched system to be operated at lower gain. The wavelength coverage of the laser is increased since it is possible to tune further into the wings of the gain profile.

In another modification, more than one round trip during which the AO is run at reduced power is implemented. In addition to allowing for extra passes through the AO modulator, an analogous improvement in spectral filtering is obtained.

We refer to this method of q-switching in which the AO modulator 118 is used in the above manner to 1) adjust the small signal gain during one or more round trips of amplification, 2) control the shape and minimize the duration of the q-switched pulse, and 3) achieve narrower line-width by increasing the number of passes through the wavelength selective filter element(s) as "gated q-switching". The design of the gated q-switched system, which differs substantially from conventional q-switched lasers, is made possible by the very high single-pass gains that are obtained with fiber amplifiers; the first n–1 round trips in an n-pass amplifier consume negligible energy in the preparation of a pulse that is capable of extracting nearly all of the energy in the nth pass.

Figure 5:
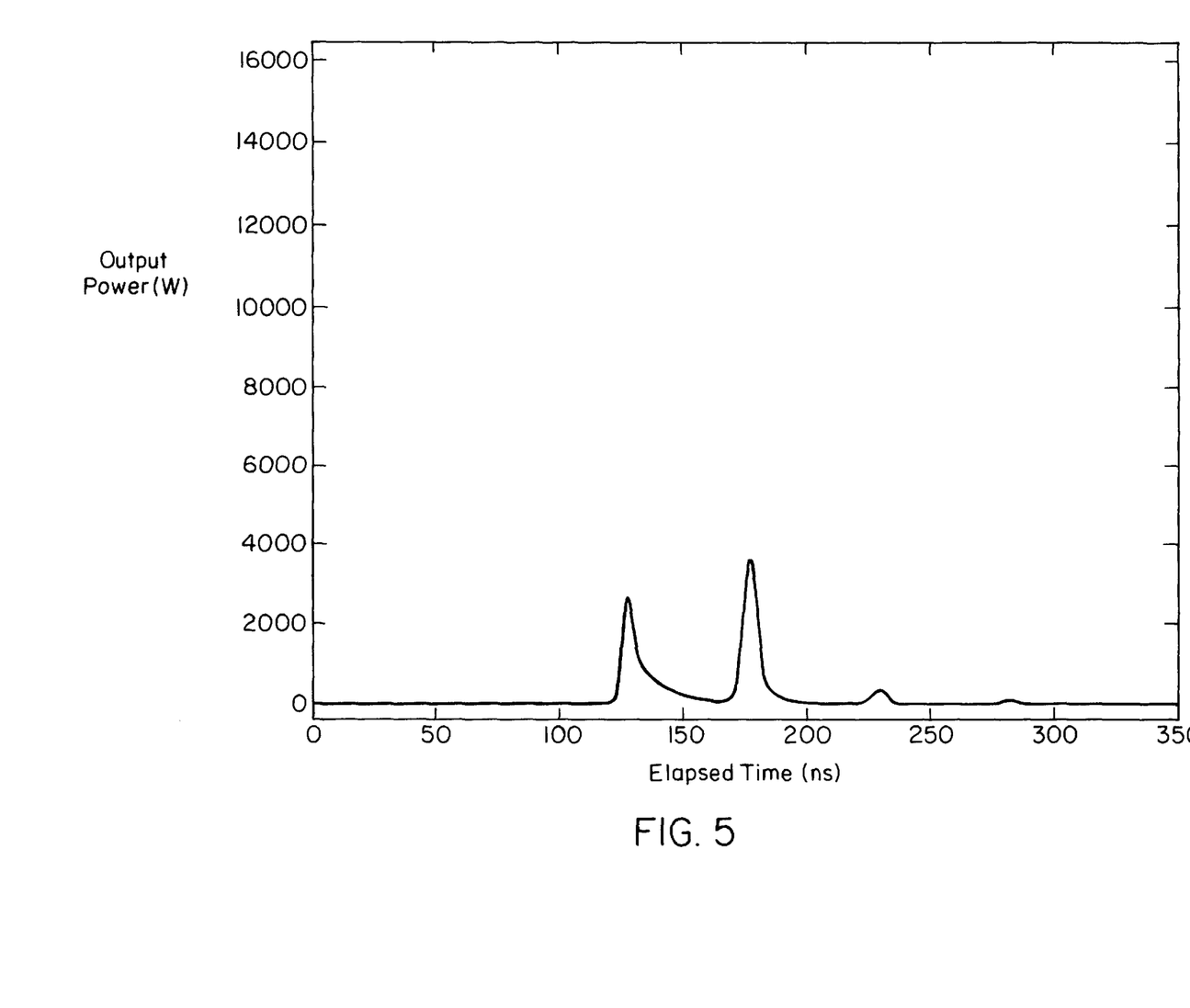
FIG. 5 is a plot of output pulse power if the acousto-optic modulator is conventionally q-switched.

To further illustrate the advantages of the gated q-switched design, the results of the simulation shown in FIG. 2 are compared to that of a fiber laser of identical construction that is q-switched in the conventional (i.e., uncontrolled) manner. The output power as a function of time for the conventional approach is shown in FIG. 5. It consists of a train of pulses at much lower power than that obtained with the gated q- switched system. In addition to achieving much higher power and a clean output waveform, the gated q-switched system leaves whatever energy is not incorporated into the high energy pulse remaining in the fiber; with conventional q-switching all of the stored energy is depleted. Because the population inversion does not start out from zero at the beginning of the pumping interval, the pulse repetition rate can be made correspondingly faster with the gated q-switched laser.

There are a number of additional considerations relating to peak power handling capability that have contributed to the design of the laser system. The threshold power for SBS and SRS is inversely proportional to length of fiber over which a high powered laser pulse travels. Although the ASE seed pulse may travel many round trips before exiting the amplifier, only for the later portion of the final round trip are the power levels at their highest. The effective interaction length for a signal undergoing exponential amplification is inversely proportional to the gain per unit length (dB/m) of the fiber amplifier. The q-switched system shown in FIG. 1 is therefore fabricated using fiber with as high a dopant concentration as is practical (For a given gain and energy storage, the length of fiber required is inversely proportional to dopant concentration).

The threshold for stimulated Brillioun scattering can be raised further by making the bandwidth of the q-switched pulses as large as possible and the pulse duration as short as possible (to the extent that a given application allows). For bandwidths greater than ~100 MHz, the threshold for SBS scales inversely with laser linewidth. For a given bandwidth, SBS can be suppressed further by making the duration of the laser pulse as short as possible (i.e., transform-limited if the rise/fall time of the AO modulator is short enough). This stems from the fact that the SBS wave travels in the opposite direction of the signal from which it depletes power. Because the two signals are counter-propagating, the SBS interaction length is drastically reduced if the duration of the laser pulse is made short enough.

Figure 6:
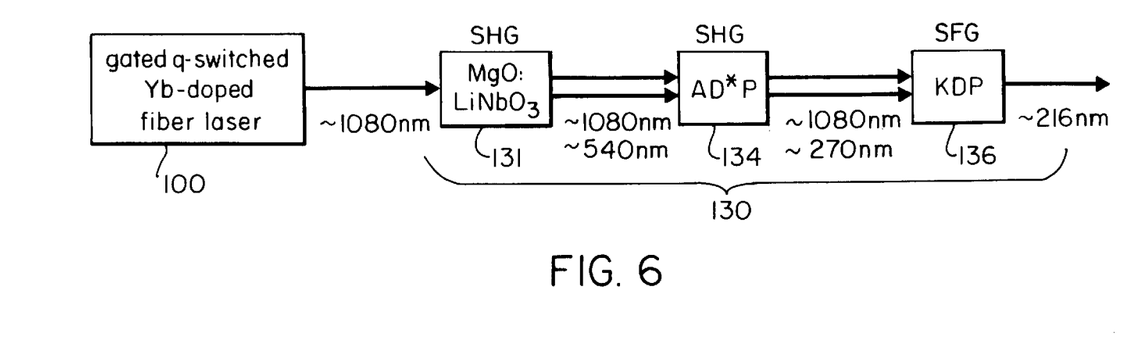
FIG. 6 is a block diagram illustrating an example frequency conversion stage.
Figure 7:
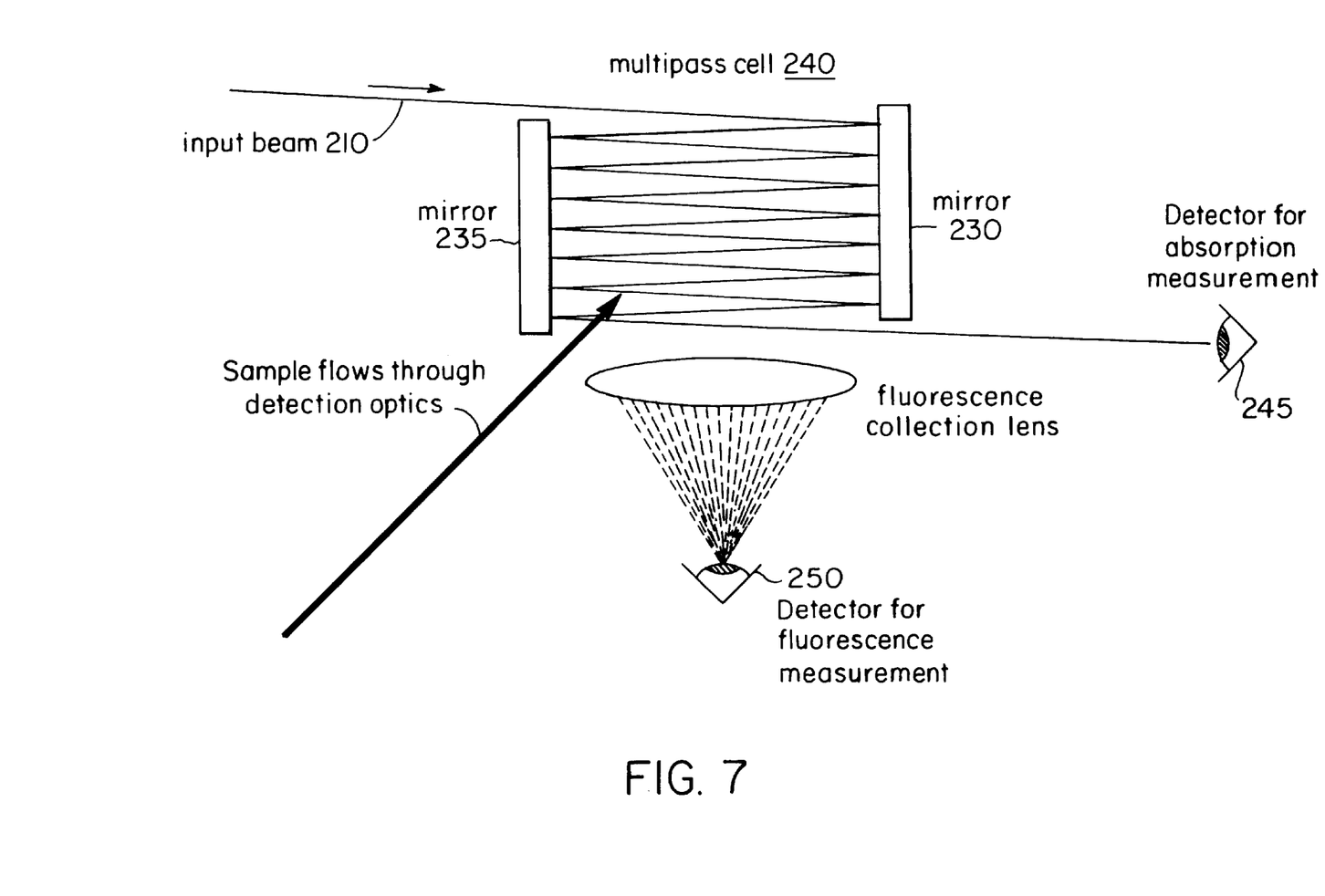
FIG. 7 is a schematic block diagram of a spectroscopic trace-species detection system of the present invention.

An application of the gated q-switched fiber laser 100 is depicted in FIG. 6 and 7.

FIG. 6 shows the frequency-conversion scheme for 5th harmonic generation of a Yb- doped laser operating in the vicinity of 1080 nm. Specifically, second harmonic generation to approximately 540 nm occurs in a $MgO:LiNbO_3$ crystal 131. Then in another second harmonic generation stage 134, AD*P (ammonium dihydrogen phosphate) generates 270 nm light. Finally, in a sum frequency generation stage 136, the 270 nm light is converted into 216 nm light in a KDP (potassium dihydrogen phosphate) crystal.

Light at ~216 nm is useful in the detection of two important pollutant species, sulfur dioxide ($SO_2$) and nitric oxide (NO). As shown in FIG. 7, absorption and/or fluorescence spectroscopy are used. With either method the UV light 210 from the system 100 is repetitively scanned on and off an absorption feature of the analyte species 220, the concentration of which is calculated from the difference between the on-line and off-line signals. In one implementation, this is achieved in a multimirror 230, 235, multipass cell 240 using either an absorption detector 245 or a fluorscence detector 250.

Less than 1 milliwatt of UV laser power is required to achieve a detection limit of less than 1 part per trillion in a signal averaging time of 1 second for both $SO_2$ and NO using the LIF detection scheme. Chemical sensors for a number of other gas-phase species are implemented in a similar manner.

In other embodiments, the same properties of the present invention, which make it useful for efficient UV generation also enable efficient generation of light in the visible, infrared, and vacuum-ultraviolet regions. There are also a number of practical applications (e.g., pumping of optical parametric oscillators) that could use the output of this pulsed laser system directly (i.e., without any frequency conversion).

Figure 8:
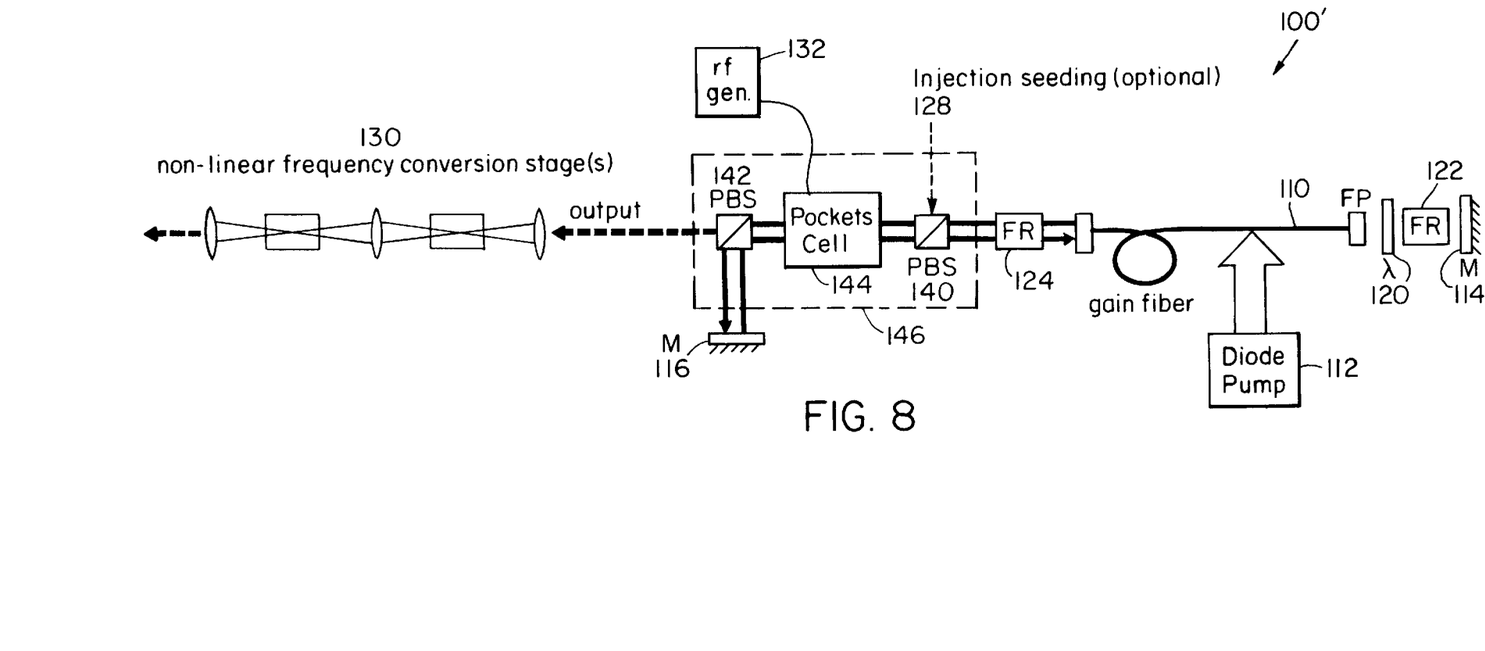
FIG. 8 is a schematic diagram of the pulsed fiber laser system of the present invention according to another embodiment.

FIG. 8 shows a second embodiment of the present invention. A similar numbering scheme to that in FIG. 1 is used to designate the similarity in the designs.

The second embodiment utilizes an electro-optic (EO) rather than an acousto-optic (AO), temporal modulator. The chief advantage of the EO 146 relative to the AO modulator is immunity to optical damage from high-peak power pulses. This is especially important with peak pulses exceeding approximately 1 kw, and above.

As shown, the EO modulator 146 comprises a Pockels cell 144 and two polarizing beam splitters 140 and 142. Injection seeding 128 preferably occurs at polarizing beam splitter 140, with the output pulse being transmitted via polarizing beam splitter 142.

Generally, AO devices have a low optical damage threshold because the beam must be brought into focus inside the AO crystal. In the volumetric region where the beam is focused to a very small diameter, approximately 30 micrometers spot size, the optical intensity is very large. In addition, the crystal materials from which high-speed AO modulators are fabricated (e.g., gallium arsenide) tend to have low optical damage thresholds, further exacerbating the situation.

The embodiment illustrated in FIG. 8, using the EO modulator 146, alleviates the problems associated with the AO modulators. The beam does not need to be brought to a focus in order for the EO modulator to function properly. Beam diameters of several millimeters are acceptable. Moreover, the materials used to fabricate EO modulators have high optical damage thresholds (e.g., deuterated potassium dihydrogen phosphate).

Another advantage offered by the EO modulator 146 is very low transmission loss in the "on" state. This allows operation at lower round-trip gain, thereby extending the wavelength tuning range of the gated q-switched system 100'.

Another benefit of low transmission loss is that the scheme used to optimize energy extraction is simplified relative to the AO-based system of FIG. 1. Instead of having to vary the "on" state transmittance of the modulator between round trips as shown in FIGS. 4A and 4B, the simplest form of gated q-switched operation can be used. Specifically, when the gain has reached its maximum value, or desired value, the modulator 146 is suddenly switched into the "on" state. The modulator is kept in the "on" state until the leading edge of the re-circulated ASE pulse has propagated a predetermined amount of round trips through the amplifier. As the leading edge of amplified ASE signal is re-entering the amplifier for the final round-trip pass, the modulator 146 is suddenly switched to the "off" state; only a short pulse is allowed to re-circulate through the amplifier on the final pass. The modulator is held in the "off" state when the amplified pulse completes the final round trip of amplification through the amplifier, allowing 100% of the pulse energy to be transmitted as output.

Notwithstanding this function, to optimize the effect of ASE seed power for efficient energy extraction, a variable attenuator is placed in series with the EO modulator 146 in modifications to this embodiment. This allows the round-trip gain of the amplifier 100' to be adjusted while keeping the energy stored in the gain fiber 110 constant. Such a scheme is much less practical when an AO modulator is used because the transmission loss for the AO is intrinsically large in the "on" state; significant further reductions in transmission efficiency cannot be afforded.

In practice, a variable attenuator is not actually necessary since the "on" state tranmittance of the EO modulator can be adjusted simply by changing the applied voltage.

In a further difference, relative to injection seeding, when the EO modulator 146 is either in the "on" or "off" states, none of the injection seed signal is re-circulated into the fiber amplifier. It is only when the EO modulator 146 is in the process of switching states that a short pulse is transmitted from the seed source of the fiber amplifier. The pulse width is roughly equal to the rise/fall time of the modulator 146. During the remainder of the amplification process, the seed laser 128 is isolated from the fiber amplifier, a situation which is desirable from the standpoint of further suppressing the growth of pre- and after-pulses.

While this invention has been particularly shown and described with references to preferred embodiments thereof, it will be understood by those skilled in the art that various changes in form and detail may be made therein without departing from the spirit and scope of the invention as defined by the appended claims.

What is claimed is:

1. A laser system, comprising:
 a fiber amplifier that amplifies optical signals in a cavity;
 a temporal filter that selectively removes loss from the cavity enabling the optical signals to build into a pulse in the cavity; and
 at least one wavelength filter that removes undesirable wavelengths from the optical signals in the cavity.

2. A system as claimed in claim 1, wherein the resonant cavity is defined by at least two mirrors.

3. A system as claimed in claim 1, wherein the fiber amplifier comprises a rare-earth-doped fiber.

4. A system as claimed in claim 1, wherein the fiber amplifier comprises single mode fiber.

5. A system as claimed in claim 1, further comprising at least two bandpass wavelength filters, one located at either end of the fiber amplifier.

6. A system as claimed in claim 1, wherein the temporal filter is an acousto-optic modulator.

7. A system as claimed in claim 1, wherein the temporal filter is an electro-optic modulator.

8. A system as claimed in claim 7, wherein the electro-optic modulator comprises at least one polarizing beam splitter and a Pockels cell.

9. A system as claimed in claim 1, wherein the temporal filter couples the optical signals out of the cavity.

10. A system as claimed in claim 1, further comprising polarizing elements that maintain a predetermined polarization in the optical signals.

11. A system as claimed in claim 10, wherein the polarizing elements comprise a linear polarizing filter and Faraday rotators.

12. A system as claimed in claim 1, wherein the fiber amplifier maintains the polarization of the light it transmits.

13. A system as claimed in claim 11, wherein the fiber amplifier is physically manipulated to create stress-induced birefringence.

14. A system as described in claim 1, further comprising a frequency conversion stage that converts a wavelength of the optical signals.

15. A system as described in claim 14, further comprising a detector which senses the converted optical signals as they are tuned on and off an absorption band of a species of interest.

16. A system as claimed in claim 1, wherein the temporal filter modulates a gain of the cavity to temporally narrow the pulse.

17. A system as described in claim 1, wherein the temporal filter is turned on for short bursts at a periodicity of the round trip travel time of the pulse in the cavity.

18. A laser pulse forming system, comprising:
 a rare-earth-doped fiber amplifier that amplifies optical signals in a cavity;

a temporal modulator that removes loss from the cavity and then couples the optical signals out of the cavity after a predetermined number of a round trips; and a bandpass optical filter that removes undesirable wavelengths from the optical signals.

19. A system as claimed in claim 18, further comprising polarizing elements that maintain a predetermined polarization in the optical signals.

20. A method for forming a laser pulse, comprising:

removing loss from a cavity;

amplifying optical signals in the cavity with a fiber amplifier;

removing undesirable wavelengths from the optical signals; and coupling the optical signals out of the cavity after a predetermined time.

21. A method as described in claim 20, further comprising amplifying the optical signals with the fiber amplifier in a double pass arrangement.

22. A method as described in claim 20, wherein the fiber amplifier comprises a rare-earth-doped fiber.

23. A method as described in claim 20, further comprising frequency converting the optical signals into ultraviolet light.

24. A method as described in claim 20, further comprising amplifying the optical signals in the cavity for a time related to a round trip travel time of the optical signals in the cavity.

25. A method as described in claim 20, further comprising amplifying the optical signals cavity with a periodicity related to a round trip travel time of the optical signals in the cavity and temporally modulating the optical signals to form a pulse.

* * * * *

UNITED STATES PATENT AND TRADEMARK OFFICE
CERTIFICATE OF CORRECTION

PATENT NO. : 5,909,306
DATED : June 1, 1999
INVENTOR(S) : Lew Goldberg, Dahv A.V. Kliner, and Jeffrey P. Koplow It is certified that error appears in the above-identified patent and that said Letters Patent is hereby corrected as shown below:

Column 1, line 14,

--GOVERNMENT SUPPORT
   The invention was supported, in whole or in part, by Grant No. NAG-1-1305 from the National Aeronautic and Space Administration and Grant No. ATM-9522028 from the National Science Foundation. The Government has certain rights in the invention.--

Signed and Sealed this

Seventh Day of December, 1999

*Attest:*

Q. TODD DICKINSON

*Attesting Officer*  *Acting Commissioner of Patents and Trademarks*